United States Patent [19]

Kuhara

[11] Patent Number: 4,859,946

[45] Date of Patent: Aug. 22, 1989

[54] MAGNETIC RESONANCE IMAGING SYSTEM

[75] Inventor: Shigehide Kuhara, Yokohama, Japan

[73] Assignee: Kabushiki Kaisha Toshiba, Kawasaki, Japan

[21] Appl. No.: 251,099

[22] Filed: Sep. 29, 1988

[30] Foreign Application Priority Data

Sep. 30, 1987 [JP] Japan .................. 62-244356

[51] Int. Cl.$^4$ ........................................... G01R 33/20
[52] U.S. Cl. .................................................. 324/309
[58] Field of Search ................ 324/307, 309, 312, 313

[56] References Cited

U.S. PATENT DOCUMENTS

| | | | |
|---|---|---|---|
| 4,165,479 | 8/1979 | Mansfield ........................... | 324/309 |
| 4,451,788 | 5/1984 | Edelstein et al. ................... | 324/309 |
| 4,625,170 | 11/1986 | Yamamoto et al. ................. | 324/309 |
| 4,644,279 | 2/1987 | Hoshino et al. ..................... | 324/309 |
| 4,644,473 | 2/1987 | Kojima et al. ...................... | 324/309 |
| 4,701,709 | 10/1987 | Yamamoto et al. ................. | 324/309 |
| 4,746,865 | 5/1988 | Kasugai .............................. | 324/309 |

FOREIGN PATENT DOCUMENTS

59-38636  3/1984  Japan .

Primary Examiner—Stewart J. Levy
Assistant Examiner—Kevin D. O'Shea
Attorney, Agent, or Firm—Oblon, Spivak, McClelland, Maier, Neustadt

[57] ABSTRACT

A magnetic resonance imaging system includes a magnetic resonance exciting unit having an imaging mode which is executed such that a slicing gradient field and a high-frequency field are applied to an object placed in a uniform static field to excite a slice of the object, a read gradient field which is repeatedly switched is applied to the object, and a phase-encoding gradient field is applied to the object, thereby generating a series of echo signals, a data acquiring unit for sampling and acquiring the echo signals generated by the exciting unit, and an image forming unit for performing image reconstruction using sampling data obtained in the imaging mode of the exciting unit. The exciting unit also has an echo position detection mode which is executed such that the fields except for phase-encoded gradient field are applied to the object to excite the slice of the object in the same manner as in the imaging mode, and to generate a series of phase-nonencoded magnetic resonance echo signals. A peak position detector detects peak positions of the series of echo signals on the basis of an operation in the echo position detection mode of the exciting unit. A correcting unit substantially corrects generation timing errors of the echo signals in the imaging mode based on the peak positions.

13 Claims, 5 Drawing Sheets

MAGNETIC RESONANCE IMAGING SYSTEM

BACKGROUND OF THE INVENTION

1. Field of the Invention

The present invention relates to a magnetic resonance imaging (MRI) system (to be referred to as an MRI system hereinafter) and, more particularly, to an MRI system for performing high-speed acquisition of magnetic resonance (MR) data (to be referred to as MR data hereinafter) of an object to be examined, the MR data being used to form a magnetic resonance image (to be referred to as an MR image hereinafter) of the object.

2. Description of the Related Art

Magnetic resonance imaging (to be referred to as MR imaging hereinafter) is a known technique for visualizing chemical and physical microscopic information of a substance by utilizing a magnetic resonance (MR) phenomenon that atomic nuclei having a specific magnetic moment resonantly absorb energy of a high-frequency rotary field having a specific frequency when the atomic nuclei are located in a uniform static field.

In MR imaging, time required for acquiring data necessary for imaging (ultrasonic echo data in ultrasonic imaging; X-ray projection data in X-ray CT (computed tomography); and MR data in MR imaging) is longer than those of the other types of medical imaging systems, such as an ultrasonic imaging system and an X-ray CT system. When an object such as a patient causes an artifact due to heatbeat, respiration and any other motion, it is very difficult to image a portion including a heart and a blood vessel system which are subjected to motion. Since time required for restricting the object to acquire imaging data is prolonged, imaging is painful to the patient.

An echo planar method by Mansfield and an ultra high-speed Fourier transform method by Hutchison et al. have been proposed as methods of reconstructing MR images at high speed in MR imaging.

Figure 1:
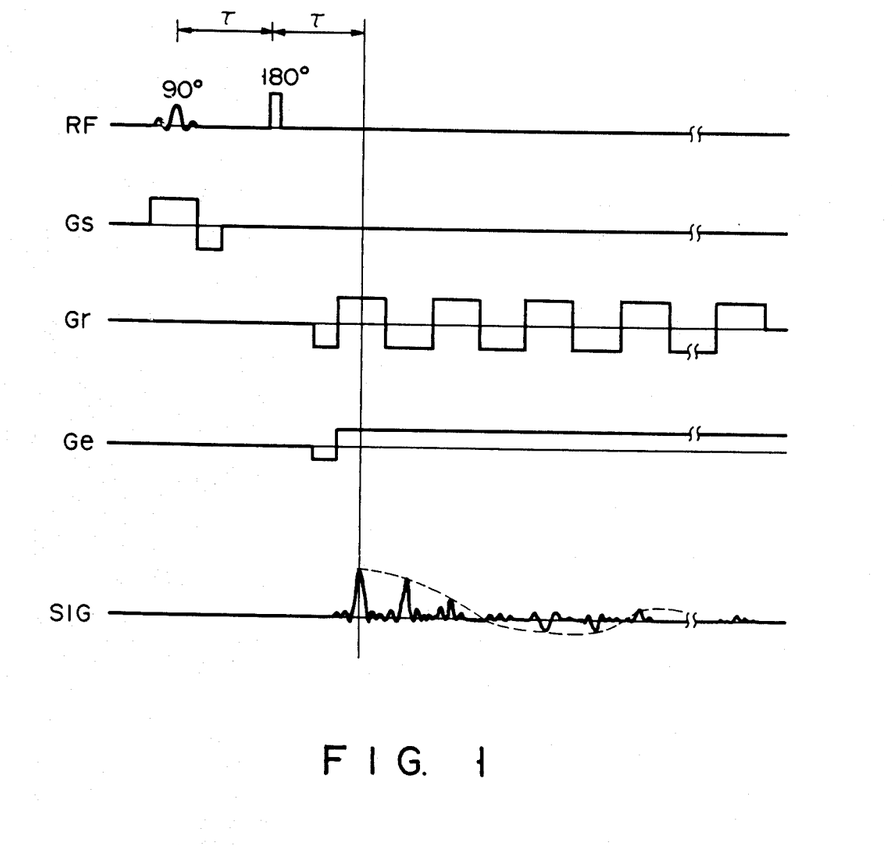
FIG. 1 is a timing chart showing a pulse sequence according to an echo planar method as an ultra high-speed imaging technique.

FIG. 1 shows a pulse sequence for acquiring MR data according to the echo planar method.

While slicing gradient field Gs is applied to an object, selective excitation 90°-pulse is applied to the object as high-frequency magnetic field RF to selectively excite magnetizations of a slice portion of the object. Thereafter, a 180°-pulse is applied to the object as high-frequency magnetic filed RF so as to refocus transverse magnetizations having dispersed phases. After the 180° pulse is applied, phase-encoding gradient field Ge is statically applied (continuously without a change) in a direction parallel to the slice plane. Read gradient field Gr is applied in a direction orthogonal to both slicing gradient field Gs and phase-encoding gradient field Ge while phase-encoding gradient field Ge is kept applied. Under these conditions, read gradient field Gr is switched a plurality of times at high speed.

Figure 2:
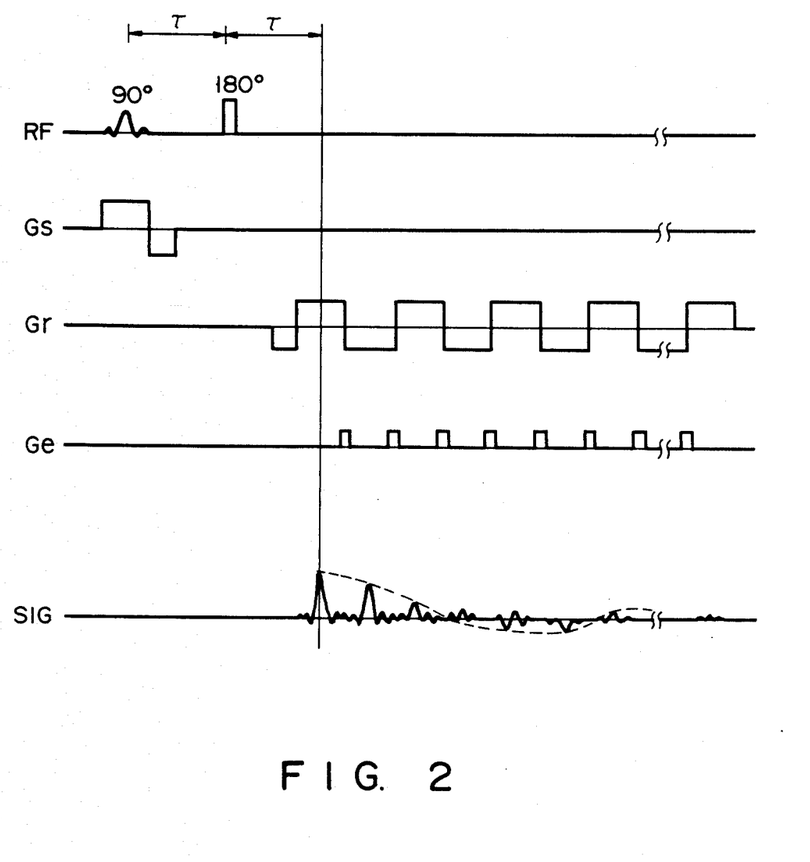
FIG. 2 is a timing chart showing a pulse sequence of an ultra high-speed Fourier transform as an ultra high-speed imaging technique.

The ultra high-speed Fourier transform method is different from the echo planar method in that phase-encoding gradient field Ge is applied as a pulse (not statically) every time read gradient field Gr is reversed, as shown in FIG. 2. High-frequency magnetic field RF (90°- and 180°-pulses), slicing gradient field Gs, and read gradient field Gr, except for phase-encoding gradient field Ge, are the same as those in the echo planar method.

In the echo planar method and the ultra high-speed Fourier transform method, read gradient field Gr is switched at high speed for a period of time when magnetization of an object excited by the 90°-pulse of high-frequency magnetic field RF is relaxed by a relaxation phenomenon of transverse magnetization. With this arrangement, a plurality of echo signals SIG (multiple echoes) based on magnetic resonance can be generated in correspondence of the number of switching cycles. In the echo planar method and the ultra high-speed Fourier transform method, phase-encoding gradient field Ge is applied to the object at least during switching to perform appropriate phase encoding. Therefore, MR data required for forming an image can be obtained by one MR excitation cycle within a short period of time. Therefore, ultra high-speed imaging can be performed according to the echo planar method and the ultra high-speed Fourier transform method.

Figure 3:
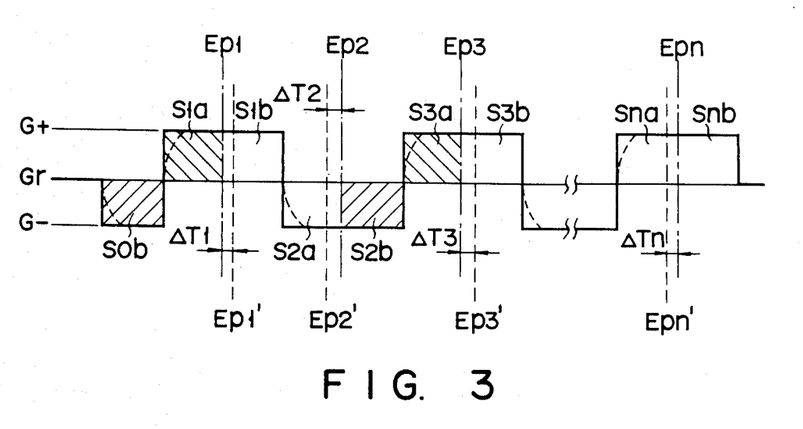
FIG. 3 is a waveform chart for explaining peak position deviations of an MR echo signal in the MRI system employing the conventional ultra high-speed imaging method.

In ultra high-speed imaging, in order to accurately reconstruct an image, peak positions of absolute values (to be briefly referred to as peak positions hereinafter) of echo signals must be equidistantly located. If the peak positions are not equidistantly located, it is impossible to accurately sample and acquire the echo signals and to reconstruct an optimal image. Each peak of the absolute value of the echo signal occurs at a time when waveform areas $S_{ia}$ and $S_{(i-1)b}$ ($i=1, 2, \ldots n$) which are divided by a reversal position (i.e., a zero-crossing point) of read gradient field Gr are equal to each other in FIG. 3. If a switching waveform of read gradient field Gr is an ideal rectangular wave, as indicated by the solid line in FIG. 3, the peak positions of the echo signals are intermediate positions between the positive and negative reversal positions, as indicated by $Ep_1$, $Ep_2$, $\ldots Ep_n$. In addition, the peak positions are equidistantly located.

However, in practice, the switching waveform of read gradient field Gr cannot be an ideal rectangular waveform due to the influences of an inductance of the gradient field and an eddy current induced by a metal conductor located near the gradient field coil. An actual switching waveform has non-sharp leading and trailing edges, as indicated by the dotted line in FIG. 3. A difference between positive and negative amplitude values G+ and G− caused by an error of a drive power source for the gradient field coil and an offset of a central value tend to occur. Due to at least one of the non-sharp waveform of read gradient field Gr, the difference between the positive and negative amplitude values and the central value offset, the peak positions of the echo signal are deviated from normal positions $Ep_1$, $Ep_2$, $\ldots Ep_n$ to $Ep_1'$, $Ep_2'$, $\ldots Ep_n'$ (FIG. 3) by $\Delta T_1$, $\Delta T_2$, $\ldots \Delta T_n$. As a result, errors occur in the intervals of the peak positions. When peak position deviations are large, an echo train is interrupted.

In order to reduce the influences of the non-sharp waveform of read gradient field Gr, the difference between the positive and negative amplitude values and the central value offset in the conventional system, a test is repeated to adjust a switching waveform of read gradient field Gr, the positive and negative amplitude values of read gradient field Gr, and the offset. However, this adjusting operation is time-consuming and cumbersome. In addition, it is very difficult to perform perfect adjustment.

SUMMARY OF THE INVENTION

It is an object of the present invention to provide an MRI system free from complex system adjustment and capable of reconstructing an optimal image in ultra high-speed imaging.

An MRI system for sampling and acquiring MR signals required for slice image reconstruction and reconstructing an image on the basis of sampling data by a sequence according to an ultra high-speed imaging method of applying a high-frequency magnetic field as a pulse and a slicing gradient field as a pulse to an object placed in a uniform static field to excite a predetermined slice, applying a read gradient field to the object under switching control, and applying a phase-encoding gradient field in a direction orthogonal to the read gradient field, comprising a detecting section for detecting peak positions of a plurality of echo signals obtained by a sequence excluding application of the phase-encoding gradient field from the sequence of the ultra high-speed imaging method, wherein timing errors of the MR echo signals are substantially corrected on the basis of peak position data detected by the detecting section.

According to the MRI system of the present invention, when the sequence of ultra high-speed imaging is performed without applying the phase-encoding gradient field to the object, echo signals having similar waveforms are obtained whenever the read gradient field is swithched and reversed. Therefore, the peak positions of the echo signals can be easily detected. The timing errors of the MR echo signals are corrected on the basis of the detected peak positions of the echo signals. This correction operation is performed by using a predetermined number of sampling data with respect to the peak position as the center. With this arrangement, even if peak position errors occur, an accurate reconstruction result based on the accurate sampling data of the echo signal components can be obtained. The above correction operation can be alternatively performed as follows. A drive source for the gradient field coil is feedback-controlled on the basis of the peak positions, and at least one of the switching timing of the read gradient field, the positive and negative amplitude values, and the offset is automatically adjusted. With this arrangement, the peak intervals of the echo signals can be kept constant.

According to the MRI system of the present invention, an accurate reconstructed image can be obtained without performing complex system adjustment in ultra high-speed imaging.

DETAILED DESCRIPTION OF THE PREFERRED EMBODIMENTS

Figure 4:
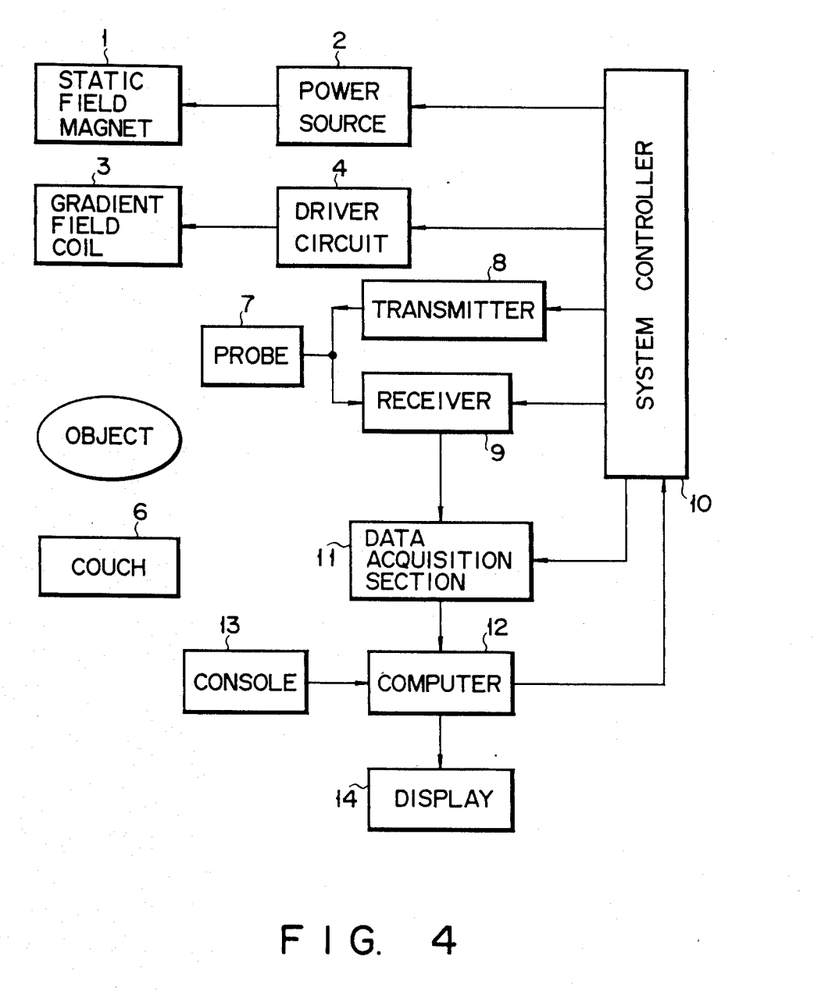
FIG. 4 is a block diagram showing an arrangement of an MRI system according to an embodiment of the present invention.

FIG. 4 shows an arrangement of an MRI system according to an embodiment of the present invention.

The system shown in FIG. 4 comprises static field magnet 1, power source 2, gradient field coil 3, driver circuit 4, couch 6, probe 7, transmitter 8, receiver 9, system controller 10, data acquisition section 11, computer 12, console 13, and display 14.

Static field magnet 1 and gradient field coil 3 are driven by power source 2 and driver circuit 4, respectively. Static field magnet 1 is made of either a normal-conductive magnet or a superconductive magnet. Static field magnet 1 and power source 2 may respectively include a shim coil and its driver. Power source 2 and driver circuit 4 are controlled by system controller 10. Static field magnet 1 applies a uniform static field to object 5 (e.g., a human body) lying on couch 6. Gradient field coil 3 applies three different gradient fields to object 5 in such a manner that its intensity is varied on a desired slice, i.e., in the x-and y-directions orthogonal to each other on the slice plane and the z-direction perpendicular to the slice plane. In this embodiment, in the following description, the z-direction gradient field, the x-direction gradient field, and y-direction gradient field are referred to as slicing gradient field Gs, read gradient field Gr, and phase-encoding gradient field Ge, respectively.

Object 5 receives a high-frequency magnetic field generated by probe 7 in response to a high-frequency signal output from transmitter 8. Transmitter 8 is controlled by system controller 10. In this embodiment, probe 7 is commonly used for a transmission coil for generating a high-frequency magnetic field and a reception coil for detecting an MR signal generated by atomic nucleus spin in object 5 and receiving the MR signal. However, separate transmission and reception coils may be arranged.

An MR signal, i.e., an echo signal received by probe 7 is amplified and detected by receiver 9. The detected signal is sent to data acquisition section 11 under the control of system controller 10. Data acquisition section 11 is operated under the control of system controller 10 and acquires echo signals extracted through receiver 9. The acquired signals are sampled and converted into digital data by an A/D (analog-to-digital) converter (not shown). The digital data is supplied to computer 12.

Computer 12 is controlled and operated by an operator through console 13. Computer 12 performs image reconstruction processing including Fourier transform by using sampling data of the echo signals input from data acquisition section 11, thereby obtaining MR image data. Computer 12 also controls system controller 10. MR image data obtained by computer 12 is supplied to display 14 and displayed as a visible image.

According to the present invention, a pulse sequence for acquiring MR echo signal data of a slice within object 5 is performed according to an echo planar method shown in FIG. 1 or ultra high-speed Fourier transform method shown in FIG. 2. Such a pulse sequence is controlled by system controller 10.

Figure 5:
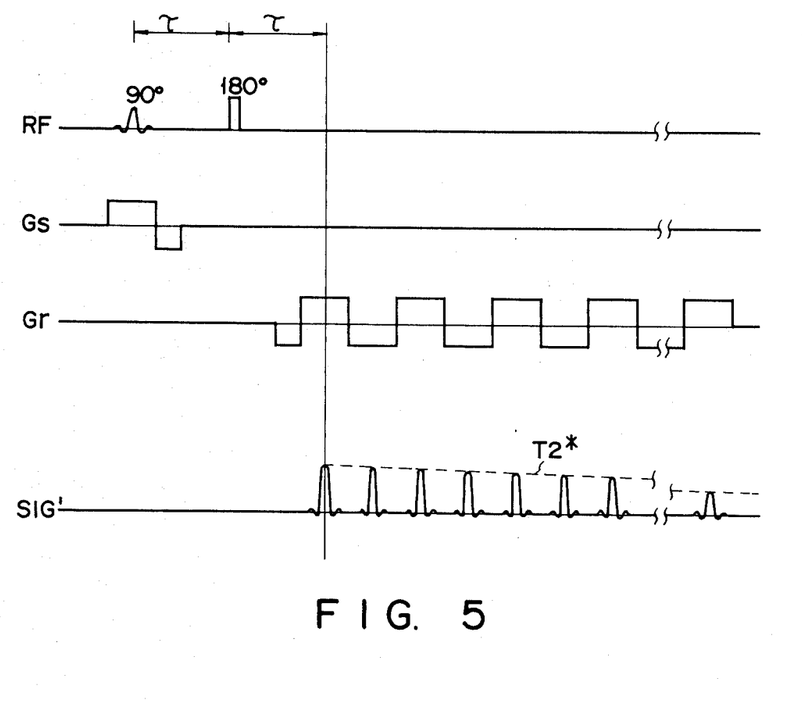
FIG. 5 is a timing chart showing a sequence for detecting peak positions of the MR echo signals in the system in FIG. 4.

In a first embodiment of the present invention, a pulse sequence (in the case of the echo position detection mode shown in FIG. 5) is executed wherein high-frequency magnetic field RF, slicing gradient field Gs, and read gradient field Gr are applied, as shown in FIG. 1 or 2, but phase-encoding gradient field Ge is not applied, prior to execution of the pulse sequence of FIG. 1 or FIG. 2 (which shows the case of the imaging mode). When the pulse sequence of FIG. 5 is performed, object 5 or an appropriate phantom in place of object 5 is placed at a predetermined position. In this case, MR echo signals having substantially similar waveforms, amplitudes of which are attenuated by a time constant T2*, are obtained as indicated by SIG' in FIG. 5. T2* represents effective transverse relaxation time in consideration of nonuniformity of a static field intensity. Peak positions (i.e., positions on the time base) of the echo signals are detected. Detection of these peak positions may be performed by software in computer 12 or by hardware in data acquisition section 11 or receiver 9. Each of waveforms of echo signals obtained by the sequence (FIG. 5) which does not apply phase-encoding gradient field Ge has one peak, and therefore the peak position can be easily detected. MR echoes are frequently detected by a quadrature coil as signals corresponding to real and imaginary parts in a Fourier space. In this case, the real and imaginary parts have a phase difference of 90°. The peak of the echo signal represents a peak value of an absolute value of the echo signal.

Figure 6:
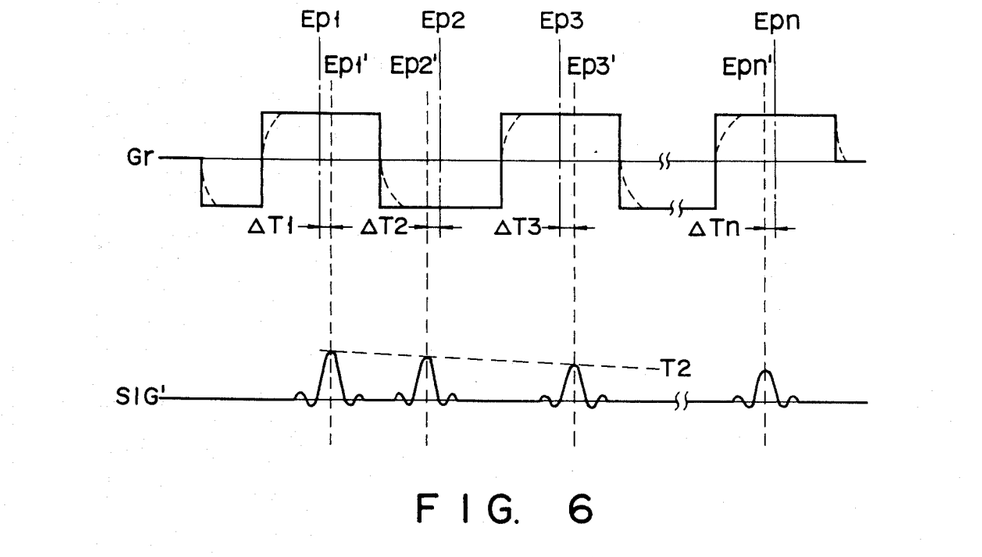
FIG. 6 is a timing chart for explaining correction processing of peak position deviations of the MR echo signal in the system shown in FIG. 4.

Data of peak positions $Ep_1'$, $Ep_2'$, ... $Ep_n'$ (of the absolute values) of the echo signals shown in FIG. 6 are stored in a memory, e.g., a memory array in computer 12.

When imaging of a slice is practically performed using the pulse sequence of FIG. 1 or 2, the number of sampling data of the echo signals (e.g., 2Ta when converted as a length of time) is larger than that of data required for constructing an image (e.g., 2Tb when converted as a length of time) in view of peak position deviations of the echo signals Ta and Tb symbolize the ½ of the period corresponding to the number of actual sampling data of echo signals and ½ of the period corresponding to the number of (sampling) data required for reconstructing an image. Then, image reconstruction performed by using sampling data of a period of ±Tb (Tb<Ta) of the larger number of sampling data with respect to the stored echo signal sampling positions $Ep_1'$, $Ep_2'$, ... $Ep_n'$ as centers.

With the above arrangement, even if peak position deviations of the echo signals occur due to the non-sharp waveform of read gradient field Gr or any other cause, accurate image reconstruction can always be performed using the echo signal sampling data with respect to the peak positions as the centers. In addition, in this case, complex system adjustment of read gradient field Gr which is required in a conventional system can be omitted.

When a sampling range includes a non-sharp waveform portion of read gradient field Gr, the corresponding data interfere with optimal image reconstruction. In this case, these data may not be used; only the remaining data may be used for the image reconstruction. If the number of remaining data is insufficient for the image reconstruction, zero filling may be performed to compensate for the lack of data. The data obtained from the non-sharp waveform portion is the same as data obtained by sampling a normal waveform at wrong sampling timings. Therefore, the non-sharp waveform of read gradient field Gr may be detected, and the sampling position can be shifted in the Fourier space for correction in accordance with the detection data.

Instead of storing peak position data and correcting the extraction range of data acquired by data acquisition section 11 in accordance with the peak position data, MR echo signals may be sampled and acquired by data acquisition section 11 in a timing range corresponding to the peak position data.

When peak positions of echo signals are greatly deviated from the normal positions and sampling data enough to perform image reconstruction cannot be obtained even according to the technique of the first embodiment, or when the number of sampling data must be decreased due to the limit of data acquisition time, feedback control is used to correct echo signal peak positions themselves according to a hardware technique of a second embodiment of the present invention.

According to the second embodiment of the present invention, an echo signal train represented by SIG' in FIG. 6 is obtained according to the pulse sequence (the echo position detection mode shown in FIG. 5) which does not apply phase-encoding gradient field Ge prior to execution of the pulse sequence of FIG. 1 or 2 (the imaging mode) in the same manner as in the first embodiment. In addition, peak positions $Ep_1'$, $Ep_2'$, ... $Ep_n'$ *of the echo signals are detected based on this echo pulse train.*

Assume that deviations of detected peak positions $Ep_1'$, $Ep_2'$, ... $Ep_n'$ of the echo signals from normal positions $Ep_1$, $Ep_2$, ... $Ep_n$ are $\Delta T_i$ (i=1, 2, ... n) in FIG. 6. Also assume that a positive amplitude of read gradient field Gr, its negative amplitude, and a reversing timing upon switching of the field are given as G+, G−, and $\tau_i$, respectively. As previously mentioned, the peak position of the echo signal appears at a timing when positive and negative waveform areas $S_{ia}$ and $S_{(i-1)b}$ (i=1, 2, ... n) of read gradient field Gr are equal to each other. In order to satisfy $S_{ia}=S_{(i-1)b}$, $\tau_i$, G+ and G−, or the offset is adjusted. For example, an adjusting operation will be wherein G+ and G− are set to be the same for all echo signals, and only switching timings $\tau_i$ are adjusted.

Figure 7:
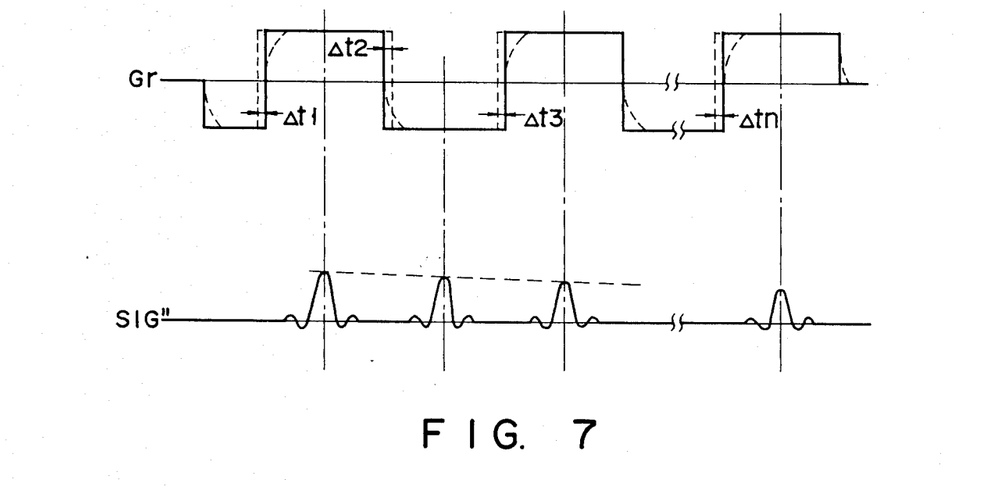
FIG. 7 is a timing chart for explaining another correction processing of peak position deviations of the MR echo signal in the system shown in FIG. 4.

The peak of the ith echo signal has a deviation of $\Delta T_i$ which can be corrected by changing a switching timing into $(\tau_i + \Delta t_i)$, as shown in FIG. 7. If the peak of the ith echo signal has a positive amplitude, the following equation is established:

$$-\Delta T_i \cdot G+ - \Delta t_i \cdot G+ = \Delta t_i \cdot G- + \Delta T_{i-1} \cdot G-$$

therefore $$\Delta t_i = -(\Delta T_i \cdot G+ + \Delta T_{i-1} \cdot G-)/(G+ + G-)$$

The $\Delta t_i$ value is calculated by computer 12, and the operation timings of a pulse sequencer in system controller 10 for controlling read gradient field Gr are controlled. With the above arrangement, a timing-corrected echo signal train shown in FIG. 7 can be obtained.

With the above operation, deviation $\Delta \tau_i$ can be eliminated theoretically by one control cycle. However, if deviation $\Delta \tau_i$ is large, it cannot be eliminated by one control cycle. In this case, the above control cycle is repeated.

If the sequence shown in FIG. 1 or 2 is adjusted as above to obtain an imaging sequence, the interval of the echo signals can be maintained to be constant, so that an accurately-reconstructed image can be obtained.

The present invention is not limited to the particular embodiments described above. Various changes and modifications may be made within the spirit and scope of the invention. In the second embodiment, the switching timing of read gradient field Gr is controlled. However, the positive and negative amplitude values G+ and G− and the offset may be controlled. In addition, at least two of these parameters may be simultaneously controlled.

The first embodiment may be combined with the second embodiment, as a matter of course.

The pulse sequence used in the present invention is not limited to the echo planar method or the high-speed Fourier transform. Any sequence of high-speed imaging for switching and applying a read gradient field may be used.

What is claimed is:

1. A magnetic resonance imaging system comprising:
   magnetic resonance exciting means having an imaging mode and echo position detection mode, the imaging mode being executed such that a slicing gradient field and a high-frequency magnetic field are applied as pulsed fields to an object placed in a uniform static field to excite a predetermined slice of the object, a read gradient field which is repeatedly switched is applied to the object, and a phase-encoding gradient field is applied to the object in a direction orthogonal to the read gradient field, thereby generating a series of magnetic resonance echo signals, and the echo position detection mode being executed such that the slicing gradient field and the high-frequency magnetic field are applied as the pulsed fields to the object placed in the uniform static field to excite the predetermined slice of the object in the same manner as in the imaging mode except that the phase-encoding gradient field is not applied to the object, and the read gradient field which is repeatedly switched is applied to the object to cause the slice to generate a series of phase-nonencoded magnetic resonance echo signals;
   data acquiring means for sampling and acquiring the echo signals generated by said magnetic resonance exciting means;
   peak position detecting means for detecting peak positions of the series of phase-nonencoded echo signals acquired by said data acquiring means on the basis of an operation in the echo position detection mode of said magnetic resonance exciting means;
   memory means for storing the peak positions detected by said peak position detecting means; and
   image forming means for performing image reconstruction using a predetermined number of sampling data of the sampling data obtained by said data acquiring means with respect to the peak positions as centers stored in said memory means on the basis of the imaging mode of said magnetic resonance exciting means, and for generating a magnetic resonance image of the slice.

2. A system according to claim 1, wherein said magnetic resonance exciting means has a longer repetition duration of switching of the read gradient field than a duration required for obtaining magnetic resonance echo signals required for image reconstruction, and said data acquiring means includes means for sampling data of the magnetic resonance echo signals for a longer sampling period than that required for obtaining the magnetic resonance echo signals.

3. A system according to claim 2, further comprising data storing means for storing sampling data of the magnetic resonance echo signals acquired by said data acquiring means, and wherein said image forming means includes means for performing image reconstruction using the sampling data read out from locations of said data storing means in correspondence with the peak positions.

4. A system according to claim 1, wherein said magnetic resonance exciting means has a longer repetition duration of switching of the read gradient field than a duration required for obtaining magnetic resonance echo signals required for image reconstruction, and said data acquiring means includes means for sampling data of the magnetic resonance echo signals for only a predetermined sampling period corresponding to the peak positions in the imaging mode of said magnetic resonance exciting means.

5. A system according to claim 1, wherein said memory means includes means for storing deviations of the peak positions detected by said peak position detecting means from a predetermined reference position.

6. A system according to claim 1, wherein said magnetic resonance exciting means comprises means for exciting magnetic resonance by a sequence according to an echo coplanar method in the imaging mode.

7. A system according to claim 1, wherein said magnetic resonance exciting means comprises means for exciting magnetic resonance by a sequence according to an ultra high-speed Fourier transform method in the imaging mode.

8. A magnetic resonance imaging system comprising:
   magnetic resonance exciting means having an imaging mode and an echo position detection mode, the imaging mode being executed such that a slicing gradient field and a high-frequency magnetic field are applied as pulsed fields to an object placed in a uniform static field to excite a predetermined slice of the object, a read gradient field which is repeatedly switched is applied to the object, and a phase-encoding gradient field is applied to the object in a direction orthogonal to the read gradient field, thereby generating a series of magnetic resonance echo signals, and the echo position detection mode being executed such that the slicing gradient field and the high-frequency magnetic field are applied as the pulsed fields to the object placed in the uniform static field to excite the predetermined slice of the object in the same manner as in the imaging mode except that the phase-encoding gradient field is not applied to the object, and the read gradient field which is repeatedly switched is applied to the object to cause the slice to generate a series of phase-nonencoded magnetic resonance echo signals;
   data acquiring means for sampling and acquiring the echo signals generated by said magnetic resonance exciting means;
   peak position detecting means for detecting peak positions of the series of phase-nonencoded echo signals acquired by said data acquiring means on the basis of an operation in the echo position detection mode of said magnetic resonance exciting means;
   control means for controlling to correct a pattern of the read gradient field applied by said magnetic resonance exciting means on the basis of the peak position data detected by said peak position detecting means; and image forming means for performing image reconstruction using sampling data obtained by said data acquiring means in the imaging mode of said magnetic resonance exciting means and for forming a magnetic resonance image of the slice.

9. A system according to claim 8, wherein said control means includes means for controlling at least one of positive and negative amplitude values, an offset, and switching timings of the read gradient field.

10. A system according to claim 9, wherein said control means includes means for calculating a correction amount of the switching timing of the read gradient field in accordance with the peak position, and means for controlling the switching timing of the read gradient field on the basis of the correction amount.

11. A system according to claim 8, wherein said magnetic resonance exciting means comprises means for exciting magnetic resonance by a sequence according to an echo planar method in the imaging mode.

12. A system according to claim 8, wherein said magnetic resonance exciting means comprises means for exciting magnetic resonance by a sequence according to ultra high-speed Fourier transform method in the imaging mode.

13. A magnetic resonance imaging system comprising:

magnetic resonance exciting means having an imaging mode and an echo position detection mode, the imaging mode being executed such that a slicing gradient field and a high-frequency magnetic field are applied as pulsed fields to an object placed in a uniform static field to excite a predetermined slice of the object, a read gradient field which is repeatedly switched is applied to the object, and a phase-encoding gradient field is applied to the object in a direction orthogonal to the read gradient field, thereby generating a series of magnetic resonance echo signals, and the echo position detection mode being executed such that the slicing gradient field and the high-frequency magnetic field are applied as the pulsed fields to the object placed in the uniform static field to excite the predetermined slice of the object in the same manner as in the imaging mode except that the phase-encoding gradient field is not applied to the object, and the read gradient field which is repeatedly switched is applied to the object to generate a series of phase-nonencoded magnetic resonance echo signals;

data acquiring means for sampling and acquiring the echo signals generated by said magnetic resonance exciting means;

image forming means for performing image reconstruction using sampling data obtained by said data acquiring means in the imaging mode of said magnetic resonance exciting means and for forming a magnetic resonance image of the slice;

peak position detecting means for detecting peak positions of the series of phase-nonencoded echo signals acquired by said data acquiring means in the echo position detection mode of said magnetic resonance exciting means; and correcting means for substantially correcting timing errors of said magnetic resonance echo signals in the imaging mode by using the peak position data detected by said peak position detecting means.

* * * * *